United States Patent
Park

[11] Patent Number: 6,009,327
[45] Date of Patent: Dec. 28, 1999

[54] HAND-OFF METHOD IN A PERSONAL COMMUNICATION SERVICE SYSTEM

[75] Inventor: Young-Chul Park, Seoul, Rep. of Korea

[73] Assignee: Samsung Electronics Co., Ltd., Rep. of Korea

[21] Appl. No.: 09/009,109

[22] Filed: Jan. 20, 1998

[30] Foreign Application Priority Data

Jan. 17, 1997 [KR] Rep. of Korea ......... 97-1236

[51] Int. Cl.$^6$ ............... H04Q 7/20; H04Q 7/22
[52] U.S. Cl. ......... 455/439; 455/436; 455/437; 455/438; 455/445; 455/432
[58] Field of Search ............... 455/439, 432, 455/436, 437, 438, 440, 441, 445, 403, 405, 442, 443, 550

[56] References Cited

U.S. PATENT DOCUMENTS 4,829,554  5/1989  Barnes et al. ............... 455/445
5,708,657  1/1998  Hong et al. ............... 455/445

*Primary Examiner*—Wellington Chin
*Assistant Examiner*—Keith Ferguson
*Attorney, Agent, or Firm*—Dilworth & Barrese

[57] ABSTRACT

A hand-off method for reducing probability of call disconnection during hand-off in a digital personal communication service (PCS) system, comprising the steps of: forming a link path between a plurality of gateway communication interconnection networks (GCINs) by using interprocess communication (IPC) to connect base station controllers (BSCs) to each other; allocating a high capacity IPC node board assembly (HINA) address for distinguishing between the GCINs in order to perform the hand-off by means of the interprocess communication between the various GCINs; and handing-off a call by using the HINA address and a link path between the GCINs, in response to a hand-off request.

2 Claims, 7 Drawing Sheets

HAND-OFF METHOD IN A PERSONAL COMMUNICATION SERVICE SYSTEM

BACKGROUND OF THE INVENTION

1. Field of the Invention

The present invention relates to a mobile radio communication system and, in particular, to a hand-off method in a digital personal communication service (PCS) system adopting a code division multiple access (CDMA) system.

2. Description of the Related Art

Referring to FIG. 1, a conventional hard hand-off method in a digital PCS system according to the prior art is shown. In this conventional digital PCS system, interprocess communication (IPC) is unavailable since, as illustrated in FIG. 1, there are no link paths formed between the plurality of gateway communication interconnection networks (GCINs) comprising the system. As a result, a hand-off procedure between the GCINs or between local communication interconnection networks (LCINs) is achieved by using a hard hand-off path (denoted as P1) between mobile switching centers (MSCs), with the hard hand-off path being interlocked with the MSC. A hand-off algorithm for providing such a hard hand-off path, however, results in a high probability of call disconnection, since it must perform many processing steps. Specifically, the probability that the call will be disconnected during the hand-off process (for call interruptions over 100 msec) is approximately 50%, which is relatively high.

One of the main causes for this disconnection problem is because the hard hand-off between the MSCs adopts a break-and-make method hand-off method. The break-and-make hand-off method involves temporarily disconnecting the call during processing for over 100 msec, during which time the MSC searches for a Base Transceiver System (BTS) having a stronger RSSI (received signal strength indication) signal of a mobile station at a new cell boundary. Consequently, the conventional hard hand-off method results in a high probability of call disconnection.

SUMMARY OF THE INVENTION

It is therefore an object of the present invention to provide a hand-off method for reducing the probability of call disconnection during the hand-off operation in a digital PCS system.

In accordance with one aspect of the present invention, a hand-off method in a personal communication service system comprises the steps of: forming a link path between gateway communication interconnection networks (GCINs) by using interprocess communication (IPC) to connect base station controllers (BSCs) to each other; allocating a high capacity IPC node board assembly (HINA) address for distinguishing between the GCINs to perform the hand-off method by means of the interprocess communication between the GCINs; and handing-off a call by using the HINA address and a link path between the GCINs in response to a hand-off request.

This and other objects, features and advantages of the present invention will become apparent from the following detailed description of an illustrative embodiment thereof, which is to be read in connection with the accompanying drawings.

DETAILED DESCRIPTION OF A PREFERRED EMBODIMENT

A preferred embodiment of the present invention will now be described in detail with reference to the accompanying drawings. For a comprehensive understanding of the present invention, the present invention will be illustratively described and confirmed to the specific embodiment. It should be understood, however, that the present invention can be implemented by one of ordinary skill in the art from the following description without unnecessary details. Accordingly, details will not be provided for functions and constructions which are either known and obvious to one of ordinary skill in the art or which are unnecessary to understand, and would merely obscure, the subject matter of the present invention.

Figure 1:
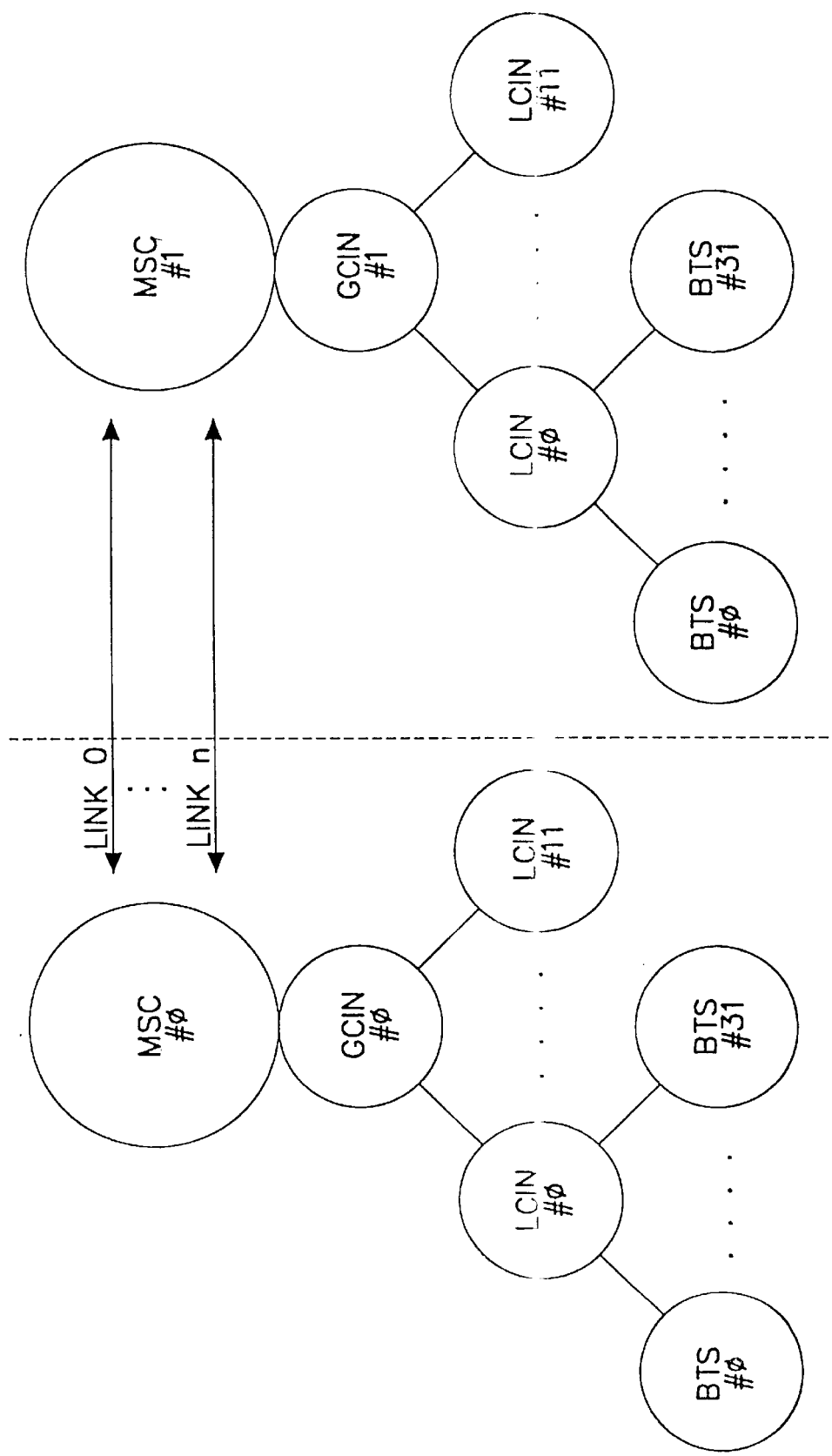
FIG. 1 is a diagram showing a conventional hard hand-off method in a digital PCS system in accordance with the prior art.
Figure 2:
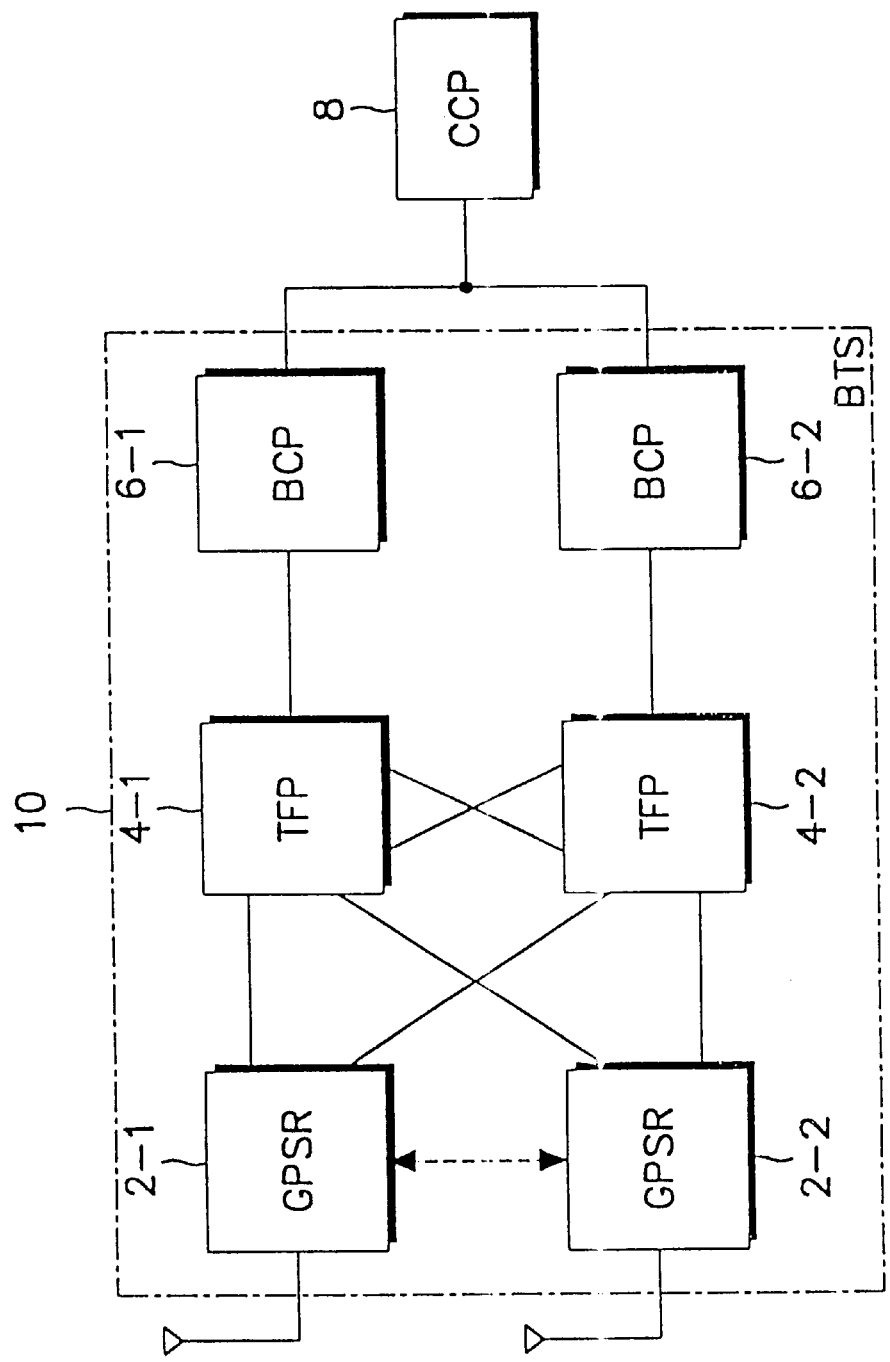
FIG. 2 is a diagram showing a soft hand-off method in a digital PCS system in accordance with the present invention.

Referring now to FIG. 2, a hand-off method in a digital PCS system in accordance with the present invention is shown. A link path P2 is formed between a plurality of gateway communication interconnection networks (GCINs) (which are packet routers) by using interprocess communication (IPC) so as to connect base station controller (BSC) groups (not shown).

Figure 5:
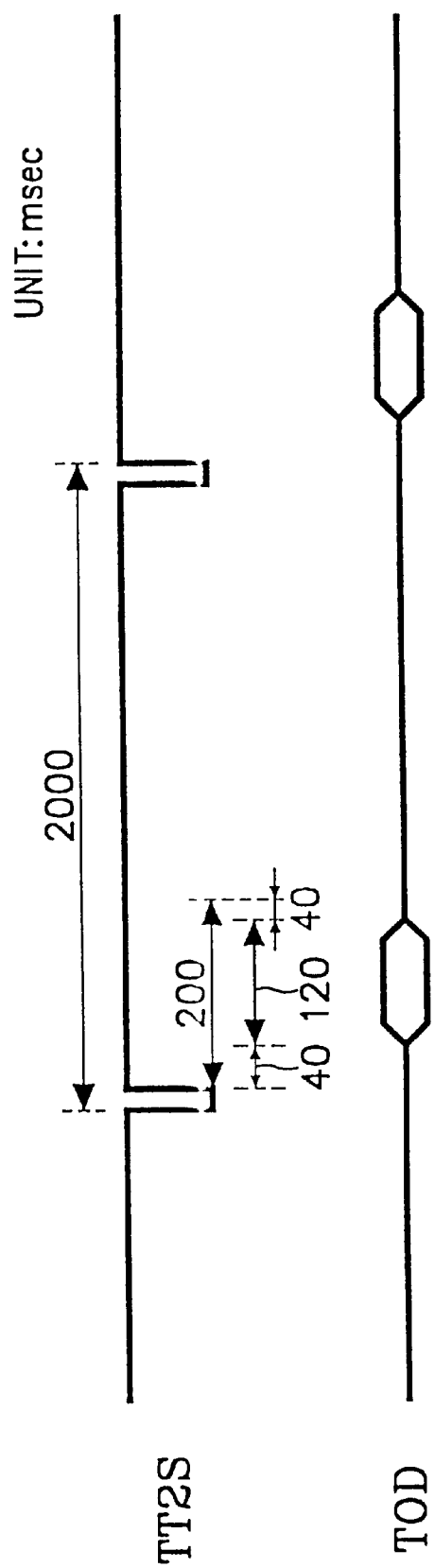
FIG. 5 is a diagram showing how a GCIN connects MSC groups with one another in accordance with the present invention.

FIG. 5 illustrates how a GCIN connects BSC groups to one another. As illustrated, each BSC includes a LCIN (Local Communication Interconnection Network). For instance, GCIN_#0 is connected to LCINs LCIN_#0–LCIN_#11 which are located in BSCs BSC_#0–BSC_#11, respectively. In addition, each BSC includes a CCP (Call Control Processor) and 32 TSBs (Transcoder Selector Bank), i.e., TSB_#0–TSB_#31). Each TSB includes a SIP (Selector Interface Processor) (not shown in FIG. 5), and each SIP consists of 5 SVPs (Selector Vocoder Processor) (also not shown in FIG. 5). The LCIN in the BSC is connected to 48 BCINs (BTS Communication Interconnection Network) (i.e., BCIN_#0–BCIN_#47) in 48 BTSs (Base Transceiver System) (i.e., BTS_#0–BTS_#47).

The BSC controls wire and wireless links, and performs the hand-off function. The LCIN in the BSC provides a link path to transmit packet data between the BTS and subsystems (i.e., CCP, TSB, BCIN, etc.) of the BSC. The TSBs in the BSC form communication paths to the BTS via the LCIN, through which traffic data and signal information are transmitted under the control of the CCP. Furthermore, the TSBs set up connection paths to the MSC, through which traffic data is exchanged. The CCP controls the call, allocates wireless resources of the BSC, and controls initialization of the TSBs and BTSs. Further, the CCP allocates a selector (not shown) in the TSB during setting up the call, and establishes a communication path between the selector (not shown) and the BTSs to hand-off the call. The CCP and TSBs TSB_#0–TSB_#31 in the BSC are connected to the MSC. The GCIN is connected to a BSM (Base Station Manager).

Figure 3:
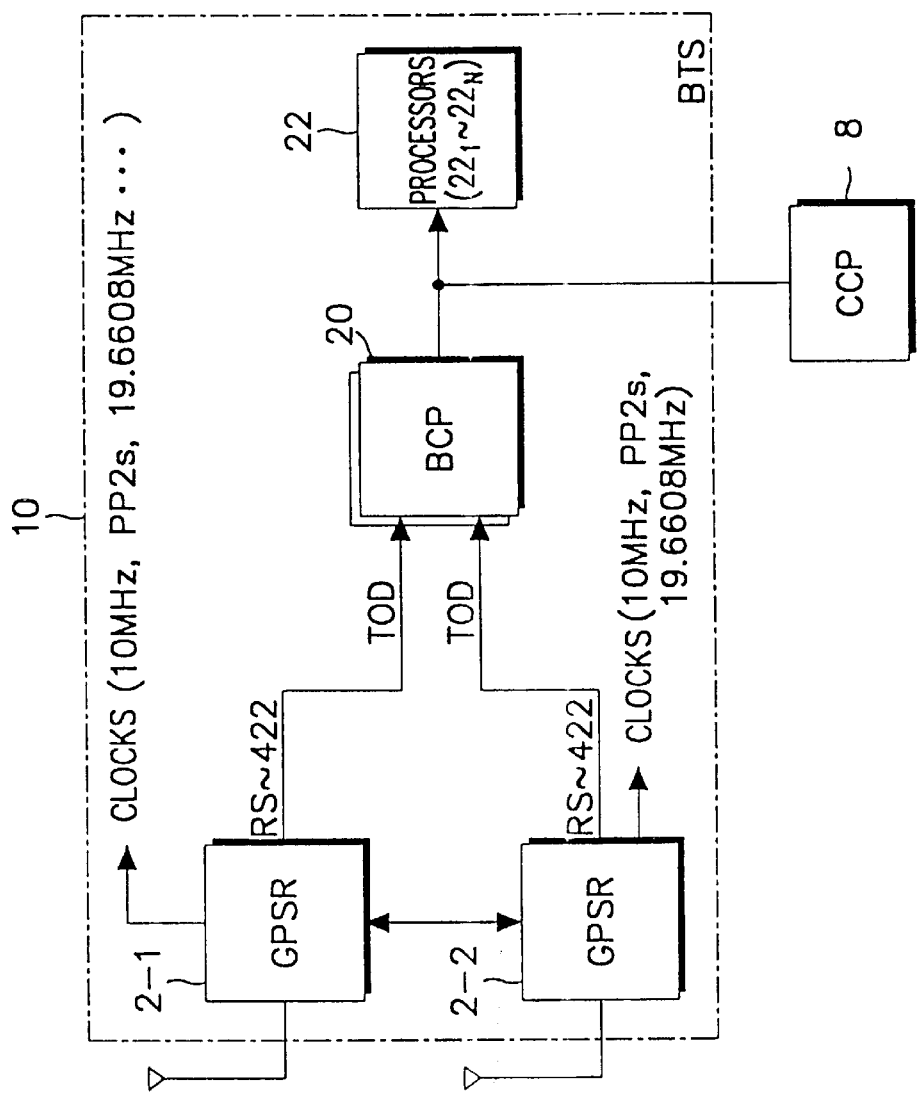
FIG. 3 is a diagram showing multiple GCIN interfacing in accordance with the present invention.

FIG. 3 shows multiple GCIN interfacing in accordance with the present invention. In order to make the multiple GCIN interfacing (i.e., interprocess communication) available, respective gateway communication interconnection networks GCIN_#0–GCIN_#3 should have their own IDs so that they may be distinguished from one another in accordance with the present invention. For distinguishing among the various GCINs (i.e., GCIN_#0–GCIN_#3), such IDs are allocated by a high capacity IPC node board Assembly (HINA) addressing.

Figure 6:
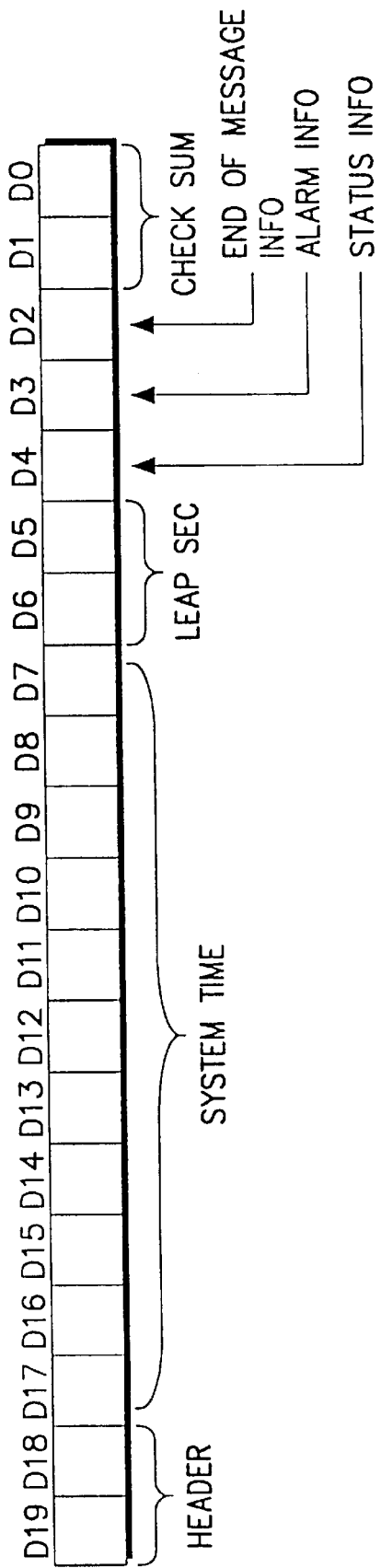
FIG. 6 is a diagram showing a HINA structure in an LCIN of a BSC in accordance with the present invention.
Figure 7:
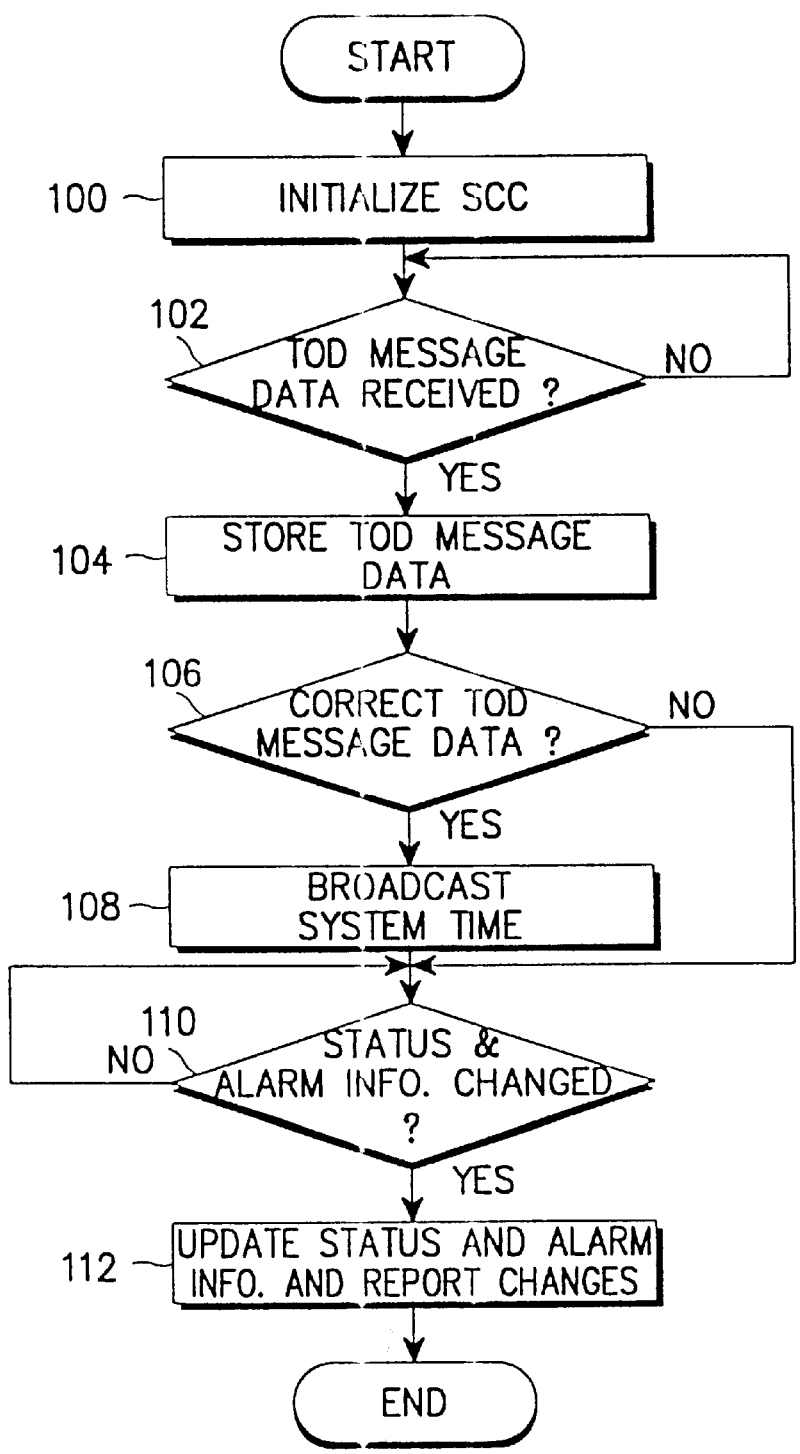
FIG. 7 is a diagram showing how GCINs are allocated by HINA addressing in accordance with the present invention.

FIG. 6 illustrates a HINA structure prepared in the LCIN of the BSC. FIG. 7 shows how the GCINs are allocated by the HINA addressing in accordance with an embodiment of the present invention. As illustrated in FIG. 6, each of the LCINs (located in the BSCs of FIG. 5) include 18 HINAs. Each HINA consists of 8 nodes N1–N7 and, consequently, one LCIN contains (8×18) 144 nodes. Each node is connected to a corresponding subsystem (i.e., BTS, CCP and TSB), the GCIN and other LCIN.

As illustrated in FIG. 7, each of the LCINs (i.e., LCIN_#0–LCIN_#11) employs 3-byte (24 bits) addressing in order to allocate the HINA address of the respective nodes. By way of example, FIG. 7 shows an allocated HINA address "0C2000 (Hexa)." The upper four bits b23–b20 (indicated by the reference numeral 10) of the 3-byte address signal represent the ID of the LCIN. For example, IDs of the LCINs are represented by the bits b23–b20 of "0000"–"1011".

Conventionally, the GCIN was allocated by the uppermost byte (i.e., upper 8 bits b23–b16) of "11110100" (F4 (Hexa)). That is, the addresses of the GCINs were set to "F4xxxx(Hexa)", where "x" represents "don't care."

In an embodiment of the present invention, the addresses of the GCINs are allocated by using the upper 4 bits b23–b20 of the 3-byte HINA address. For instance, in case where the system includes four gateway communication interconnection networks GCIN_#0–GCIN_#3, two bits b21 and b20 out of the upper four bits b23–b20 of the HINA address are allocated for the GCINs. That is, as indicated by the reference numeral 20 in FIG. 7, the upper 4 bits b23–b20 of "1100", "1101", "1110" and "1111" are allocated for GCIN_#0, GCIN_#1, GCIN_#2 and GCIN_#3, respectively. Further, if the system includes sixteen gateway communication interconnection networks GCINs, all of the upper four bits b23–b20 are used.

Figure 4:
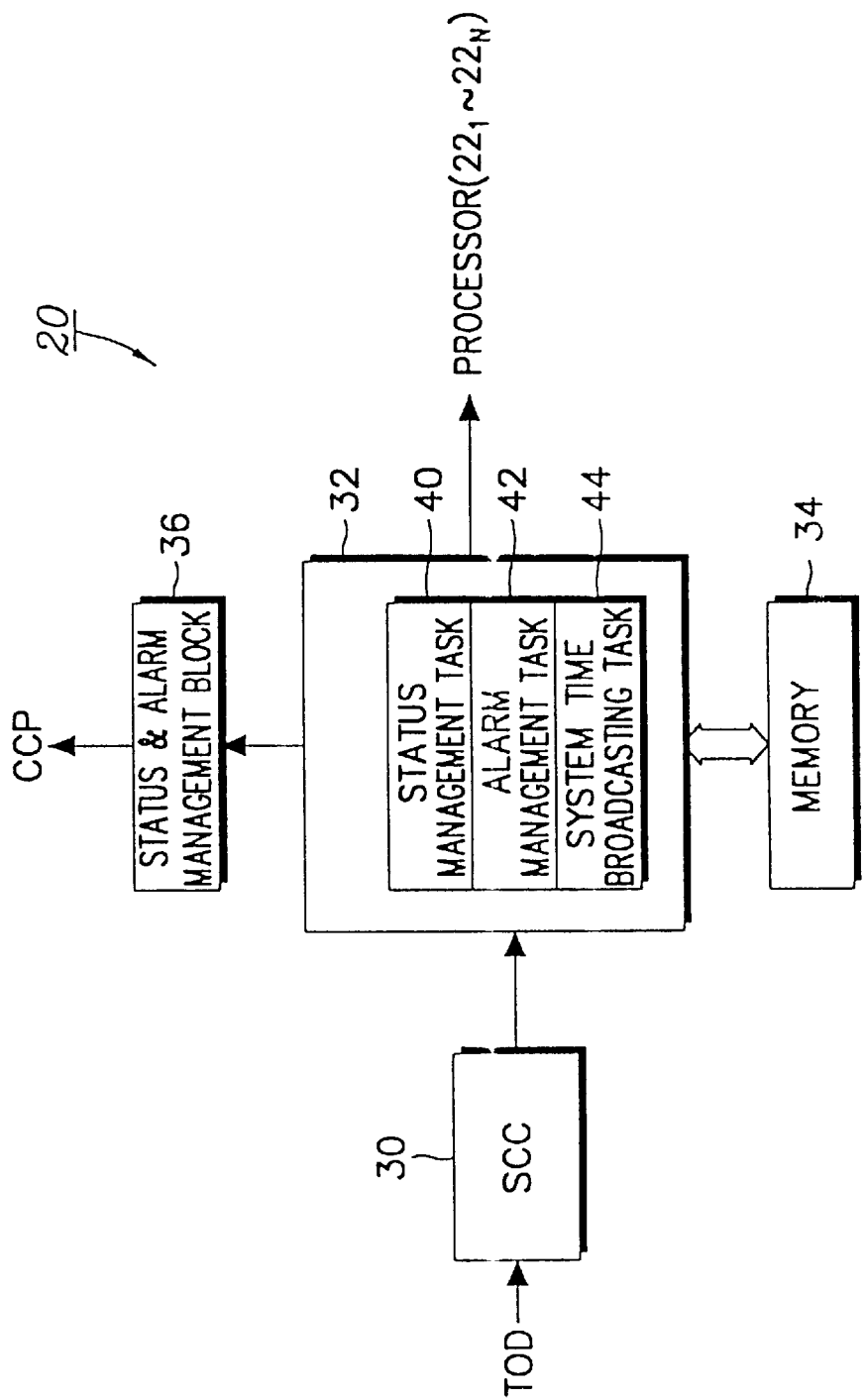
FIG. 4 is a diagram showing a soft hand-off method between GCINs in accordance with the present invention.

Referring to FIG. 4, a packet processing through an IPC link path P2 between GCIN_#0 and GCIN_#1, for example, is achieved by a make-and-break soft hand-off method in accordance with the present invention. With reference to FIG. 4, if a mobile station (MS) 30 moves to a cell boundary, the BSC_#0 currently providing the call service transmits the packet data for band-off not only to the BTS_#0 in the current cell but also to the BTS_#1 in the adjacent cell. In this case, the destination address of the packet data is determined by the BSC_#0. The GCIN_#0 and the GCIN_#1 have the link path P2 formed therebetween according to the present invention, and have the HINA address allocated therefor.

The BTS_#0 of the BSC_#0 measures the RSSI (Received Signal Strength Indication) signal of the mobile station 30 through BCIN_#0 of the BTS_#0 which is currently providing the call service in the BSC_#0 (the call process flow is SVP_#0 (not shown)-SIP_#0 (not shown)-LCN_#0). Similarly, the BTS_#1 of the BSC_#1 measures the RSSI signal of the mobile station 30 through the soft hand-off path of SVP_#0 (not shown)-SIP_#0 (not shown)-LCIN_#0–GCIN_#0–LCIN_#1–BCIN_#1. As a result, the mobile station 30 is handed-off to a side having the stronger RSSI signal, thereafter cutting off the call to the other side having the weaker RSSI signal. In this way, it is possible to maintain a normal call, without the hard hand-off algorithm.

As described above, the soft hand-off method of the invention distributes a call to several MSCs (as opposed to connecting the call to a specified MSC) and avoids the hard hand-off between the MSCs, thereby maintaining the stability of the call. Furthermore, since the present invention eliminates the need for a hard hand-off request between the MSCs and an acknowledge message (ACK) in response to the hard hand-off request, it is possible to delete such unnecessary messages between the MSCs.

Although illustrative embodiments of the present invention have been described herein with reference to the accompanying drawings, it is to be understood that the invention is not limited to those precise embodiments, and that various other changes and modifications may be affected therein by one skilled in the art without departing from the true scope or spirit of the invention.

What is claimed is:

1. A hand-off method in a personal communication service system, comprising the steps of:

forming a link path between gateway communication interconnection networks (GCINs) by using interprocess communication (IPC) to connect base station controllers (BSCs) to each other;

allocating a high capacity IPC node board assembly (HINA) address for distinguishing between said GCINs, to perform band-off by means of the interprocess communication between said GCINs; and handing-off a call by using said HINA address and a link path between said GCINs, in response to a hand-off request.

2. The hand-off method as claimed in claim 1, wherein said Hina Address includes four upper bits, said 4 upper bits being used for distinguishing said GCINs from one another.

* * * * *